US008808801B2

(12) United States Patent
Krunks et al.

(10) Patent No.: US 8,808,801 B2
(45) Date of Patent: Aug. 19, 2014

(54) METHOD OF PREPARING ZINC OXIDE NANORODS ON A SUBSTRATE BY CHEMICAL SPRAY PYROLYSIS

(71) Applicants: Malle Krunks, Tallinn (EE); Ilona Oja-Acik, Tallinn (EE); Tatjana Dedova, Tallinn (EE)

(72) Inventors: Malle Krunks, Tallinn (EE); Ilona Oja-Acik, Tallinn (EE); Tatjana Dedova, Tallinn (EE)

(*) Notice: Subject to any disclaimer, the term of this patent is extended or adjusted under 35 U.S.C. 154(b) by 0 days.

(21) Appl. No.: 13/851,266

(22) Filed: Mar. 27, 2013

(65) Prior Publication Data
US 2013/0236646 A1 Sep. 12, 2013

Related U.S. Application Data

(63) Continuation of application No. 11/911,565, filed as application No. PCT/EE2006/000002 on Apr. 13, 2006, now abandoned.

(60) Provisional application No. 60/671,232, filed on Apr. 14, 2005.

(51) Int. Cl.
B05D 3/02 (2006.01)
H01L 21/02 (2006.01)
C23C 4/10 (2006.01)

(52) U.S. Cl.
CPC .......... *H01L 21/02603* (2013.01); *C23C 4/105* (2013.01)
USPC .......... 427/314; 427/421.1; 427/453

(58) Field of Classification Search
CPC .. C23C 4/105; H01L 21/02603; C04B 41/009
USPC .................. 427/421.1, 314, 453
See application file for complete search history.

(56) References Cited

U.S. PATENT DOCUMENTS 3,630,701 A * 12/1971 Javaux et al. ............ 65/27
2005/0255629 A1* 11/2005 Han et al. .............. 438/104

FOREIGN PATENT DOCUMENTS

CN 1557718 A * 12/2004

OTHER PUBLICATIONS

Abou-Helal, M.O. et al., "Rare Earth Ion Doped Semiconducting Films by Spray Pyrolysis", Journal of Non-Crystalline Solids, 1997, pp. 139-145, vol. 218, Elsevier Science B.V.*
Okuyama, Kikuo et al., "Preparation of Nanoparticles Via Spray Route", Chemical Engineering Science, 2003, pp. 537-547, vol. 58, Elsevier Science Ltd.*
Park et al. "Temperature-Induced Morphological Changes of ZnO Grown by Metalorganic Chemical Vapor Deposition", Journal of Crystal Growth, 2005, pp. 158-164, vol. 276, Elsevier BY.*

* cited by examiner

*Primary Examiner* — Alexander Weddle
(74) *Attorney, Agent, or Firm* — Maine Cernota & Rardin

(57) ABSTRACT

A method of preparing nanostructured zinc oxide layers on a substrate by chemical spray pyrolysis at moderate deposition temperatures from 350.degree. C. to 600.degree. C. is disclosed. An aqueous or aqueous alcoholic solution comprising zinc chloride or zinc acetate as precursors is prepared and sprayed onto the preheated substrate so that the precursor reacts to form zinc oxide layer on the substrate. Thiourea or urea may be also added to the solution. Glass, silicon, or metal oxide covered glass can be used as the substrate.

18 Claims, 10 Drawing Sheets

METHOD OF PREPARING ZINC OXIDE NANORODS ON A SUBSTRATE BY CHEMICAL SPRAY PYROLYSIS

RELATED APPLICATIONS

This application is a continuation of U.S. application Ser. No. 11/911565, now abandoned filed Oct. 15, 2007, which is a 371 national phase application of PCT Application Ser. No. PCT/EE2006/000002, filed Apr. 13, 2006, and which, claims the benefit of U.S. Provisional Application No. 60/671,232, filed Apr. 14, 2005. Each of these applications is herein incorporated by reference in their entirety for all purposes.

FIELD OF THE INVENTION

The invention relates to zinc oxide (ZnO) nanostructures, such as nanorods and nanoneedles, and to a method for manufacturing thereof, and more particularly, to a method of preparing highly structured zinc oxide layers comprising zinc oxide nanorods or nanoneedles, on various substrates by chemical spray pyrolysis (CSP) at moderate deposition temperatures of the substrate (from about 400 to 600.degree. C.).

Such nanorods are individual single crystals with high purity. CSP is technologically simple deposition technique where no costly equipment is needed. Therefore, the invention provides very cheap and simple method, compared to alternative methods, for manufacturing zinc oxide nanostructures.

BACKGROUND OF THE INVENTION

Zinc oxide is one of the most promising materials for optoelectronic applications due to its wide band gap of 3.37 eV and large exiton binding energy of 60 meV. Zinc oxide nanostructures have wide range of potential applications also in areas such as solar cells, field emission devices, chemical and biological sensors, photocatalysts, light emitting devices, including light emitting diodes, and nano-sized lasers.

Flat zinc oxide layers (i.e., as opposed to a layer, comprising nanorods, nanoneedles, nanowires, etc structures) are widely used for electronic and optoelectronic devices, for example, as transparent electrodes in thin film solar cells where simultaneously a high transparency and a low resistivity is required, but also in thin film gas sensors, varistors, and surface acoustic-wave devices.

Flat zinc oxide layers are conventionally prepared by several technologies, including sputtering, chemical vapour deposition, sol-gel deposition, atom layer deposition, molecular beam epitaxy, and different spray pyrolysis technologies (ultrasonic spray, pneumatic spray, pressure spray). In contrast to the other deposition techniques, the advantage of spray technique is its extreme simplicity. So the capital cost and the production cost of high quality metal oxide semiconductor films are expected to be the lowest compared to all other techniques. Furthermore, this technique is also well suited for mass production systems.

Chemical spray pyrolysis is a well-known, cheap and simple deposition technique to prepare thin films of metal oxides, sulfides and tellurides, etc. for application in electronics and optoelectronics. U.S. Pat. No. 3,148,084 to Hill (Sep. 8, 1964) for a process for making conductive film describes a process of making homogeneous microcrystalline semiconductive and photoconductive films, e.g. cadmium sulphide. The method was simpler to operate, and more efficient, versatile and economical than previously known methods of forming semiconductive layers.

Spray technologies have been used for different materials and applications by Chamberlin R. R. et al (Chemical Spray Deposition for Inorganic films, J. Electrochemical Soc. 113 (1966) 86-89), Feigelson R. S. et al. (II-VI Solid Solution Films By spray Pyrolysis, J. Appl. Phys. 48 (1977) 3162-3164), Aranovich J. et al (Optical and Electrical Properties of ZnO Films Prepared by Spray Pyrolysis for Solar Cell Application, J. Vac. Sci. Technol. 16 (1979) 994-1003), Turcotte R. L. (U.S. Pat. No. 4,338,362 for Method to synthesize and Produce Thin Films by Spray Pyrolysis, issued Jul. 6, 1982), Major S. et al (Thin Solid Films, 108 (1983) 333-340, Thin Solid Films, 122 (1984) 31-43, Thin Solid Films, 125 (1985) 179-185), Ortiz S. et al (J. of Non-Crystalline Solids, 103 (1988) 9-13, Materials Chemistry and Physics, 24 (1990) 383-388), Caillaud F. et al (J. European Ceramic Society, 6 (1990) 313-316).

To prepare flat films of zinc oxide by spray usually zinc salts e.g. zinc acetate, zinc nitrate etc. can be used as precursor materials. Appropriate additives as salts of Indium, Aluminum or Terbium were added into the spray solution to make the films electrically conductive (European Patent application No 336574 to Sener for producing a layer of transparent conductive zinc oxide, priority date 6 Apr. 1988) and cobaltous or chromium acetylacetonates to accelerate the growth of the films in spray process (European Patent No 490493 to Platts for A process for depositing a layer of zinc oxide onto a substrate, date of filing 14 Nov. 1991, priority 12 Dec. 1990;U.S. Pat. No. 5,180,686 to Banerjee for Method for continuously depositing a transparent oxide material by chemical pyrolysis, issue date Jan. 19, 1993).

Zinc oxide nanopowder is also widely used, e.g., in sunscreens, paints, plastics, cosmetics because of its property to absorb ultra-violet radiation. Different methods are used to produce such powder. Spherical ZnO microcrystals could be obtained by spray pyrolysis (see, e.g., M. Andres-Verges, et al, J. Materials Science 27 (1992) 3756-3762, Kikuo Okuyama et al Chemical Engineering Science 58 (2003) 537-547, Kang, Y. C. et al Journal of Aerosol Science, 26 (1995) 1131-1138). In U.S. Pat. No. 6,036,774 to Lieber (filing date 22 Jan. 1997, issue date 14 Mar. 2000) for method of producing metal oxide nanorods describes metal oxide nanorods with diameter between 1 and 200 nm and aspect rations between 5 and 2000, produced by controlled vapour-solid growth processes in a furnace from a metal vapour source such as a mixture of a bulk metal oxide powder and carbon powder, and a low concentration of oxygen gas.

Rod-like zinc oxide nanoparticles/crystals of different size are made by deposition from solutions (M. Andres-Verges, et al, J. Materials Science 27 (1992) 3756-3762), by hydrothermal synthesis in solutions (Wei H. et al Materials Science and Engineering A, 393 (2005) 80-82, Bai F. et al Materials Letters 59 (2005) 1687-1690, Guo M. et al Applied Surface Science, In Press, Corrected Proof, Available online 7 Jan. 2005, Kiwamu Sue et al Materials Letters, 58 (2004) 3350-3352), by chemical bath deposition (A. M. Peiro et al Thin Solid Films, In Press, Corrected Proof, Available online 20 Jan. 2005, Zhuo Wang Journal of Solid State Chemistry, 177 (2004) 2144-2149, etc.), thermal or physical vapour deposition (Mardilovich P. et al U.S. Pat. No. 6,770,353 B1; D. W. Zeng et al, Journal of Crystal Growth, 266 (2004) 511-518), chemical vapour deposition (G. Z. Wang et al. Materials Letters, 58 (2004) 2195-2198, Jae Young Park et al, Journal of Crystal Growth, In Press, Corrected Proof, Available online 15 Dec. 2004, U.S. Patent Applications No. 2003/0213428A1 to X. Lu et al, Nos. US2004/0127130A1 and 2004/0252737A1, and PCT application WO 2004/114422A1 to Yi G. C. et al).

However, the background art does not suggest that chemical spray pyrolysis can be used for preparing highly structured zinc oxide, namely nanostructured layers comprising ZnO nanorods or nanoneedles, on various substrates.

DISCLOSURE OF THE INVENTION

The method of growing nanostructured zinc oxide (ZnO) layers on a substrate according to present invention comprises the steps of heating a substrate to a predetermined temperature, atomizing a solution, comprising a precursor, such as zinc chloride ($ZnCl_2$) or zinc acetate ($Zn(CH_3COO)_2$), and a solvent, into small discrete droplets using spray pyrolysis; and depositing the atomized solution to the substrate, using predetermined solution feeding rate. The solvent evaporates when the droplets reach the substrate and the precursor reacts to form a plurality of zinc oxide nanorods (or, in some cases, nanoneedles) on said substrate.

Aqueous or aqueous-alcoholic solution of zinc chloride or zinc acetate is used. Fine droplets of said solution are produced by atomizing of the solution with the help of ultrasonic or pneumatic spray techniques. The deposition process is carried out in air, compressed air, nitrogen or argon are used as carrier gases.

The aqueous or aqueous-alcoholic solution of zinc chloride may additionally contain thiourea (thiocarbamide $SC(NH_2)_2$) or urea (carbamide, $OCN_2H_4$). Adding thiourea or urea to the aqueous or aqueous-alcoholic solution of zinc acetate may also be useful in some cases.

The substrate can be, e.g., glass, silicon or quartz (quartz slide). The substrate can be covered by a flat layer of different metal oxides, e.g., indium tin oxide, tin oxide, titanium oxide, zinc oxide.

The nanocolumnar zinc oxide layers are consisting of well-developed hexagonal nanorods of single crystal zinc oxide with length from 50 nm up to six-seven microns, the diameter of rods could be varied from some tens of nanometers up to 1 micron.

The shape and size of zinc oxide crystals are controlled by several parameters, including the growth temperature, stock solution composition, concentration of precursors in stock solution, solution feeding rate, type of substrate, type of a flat layer of metal oxide (also called underlayer), and carrier gas flow rate.

MODES FOR CARRYING OUT THE INVENTION

Figure 1:
FIG. 1 is a SEM cross-section of the nanostructured zinc oxide layer that is deposited from aqueous solution of zinc chloride (0.05 mol/l) onto glass substrate that was placed onto the soldered tin bath heated up to 600.degree. C., and using the solution feeding rate of 2.4 ml/min.
Figure 2:
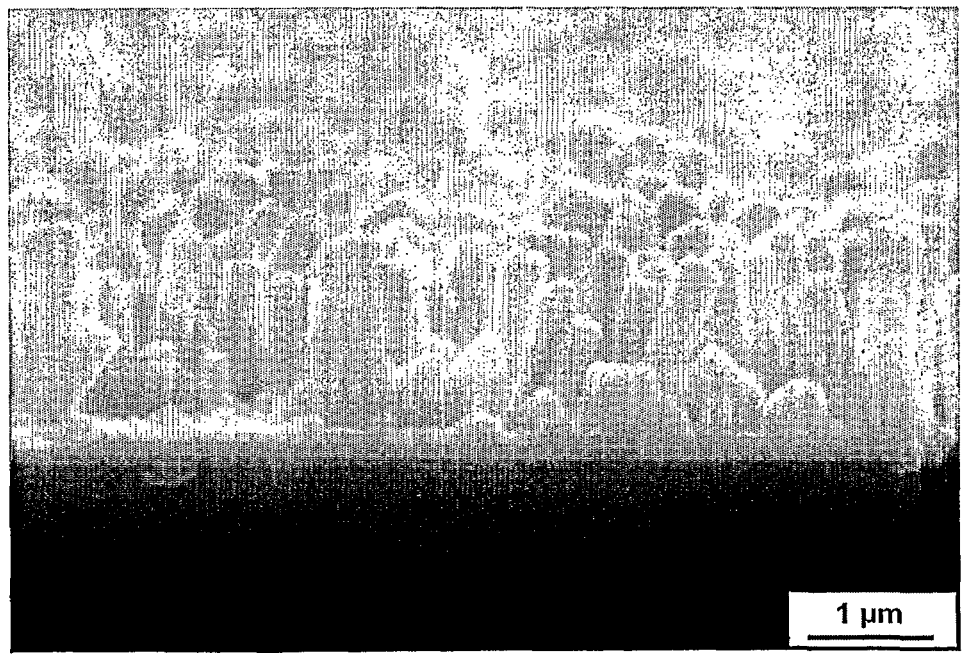
FIG. 2 is a SEM cross-section of the nanostructured zinc oxide layer that is deposited from aqueous solution of zinc chloride (0.1 mol/l) onto glass substrate covered with conductive indium tin oxide (ITO) layer, whereas the glass substrate was placed onto the soldered tin bath heated up to 600.degree. C., and using the solution feeding rate of 2.4 ml/min.
Figure 3:
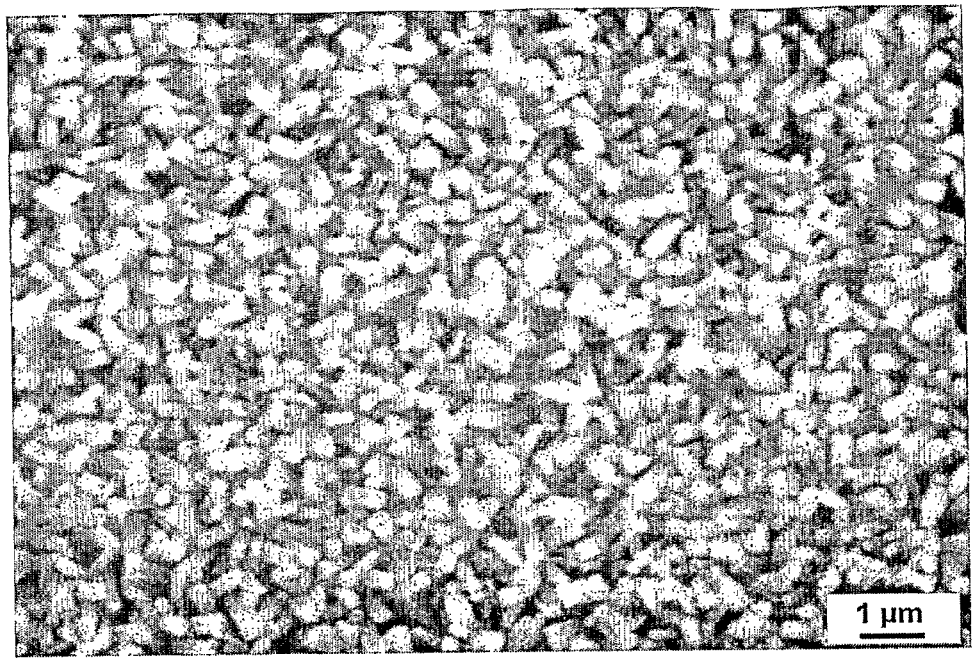
FIG. 3 is a SEM micrograph of the surface of the nanostructured zinc oxide layer that is deposited from aqueous solution of zinc chloride (0.1 mol/l) onto glass substrate covered with dense film of ZnO:In with thickness of about 300 .mu.m, whereas the glass substrate was placed onto the soldered tin bath heated up to 600.degree. C., and using the solution feed rate of 2.4 ml/min.
Figure 4:
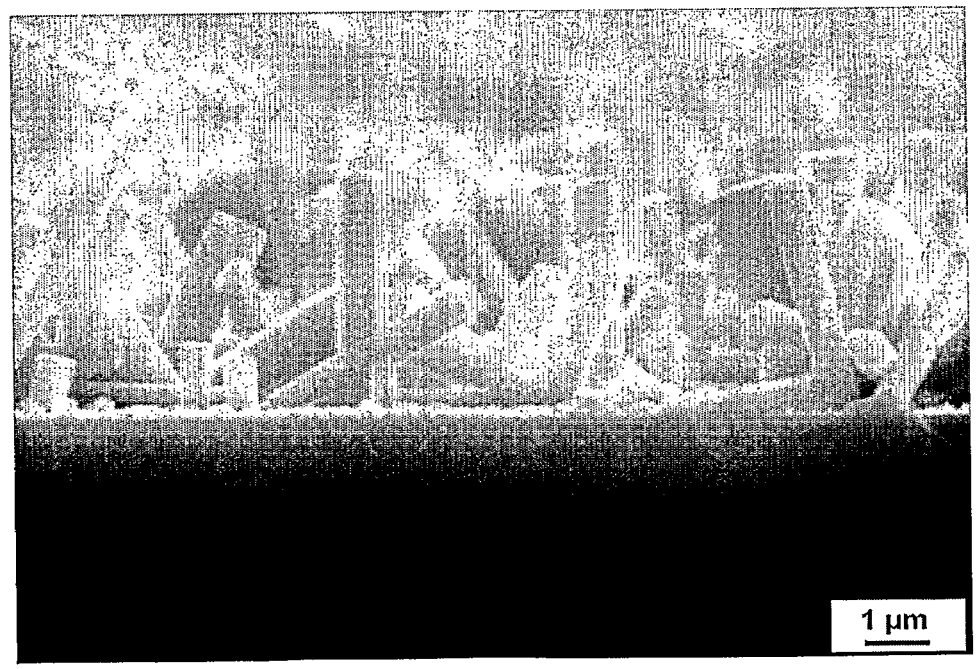
FIG. 4 is a SEM cross-section of the nanostructured zinc oxide layer that is prepared from zinc chloride solution with concentration of 0.2 mol/l onto the glass substrate that was placed onto the soldered tin bath heated up to 600.degree. C., and using the solution feed rate of 1.7 ml/min.
Figure 5:
FIG. 5 is a SEM cross-section of the nanostructured zinc oxide layer that is prepared from zinc chloride solution with concentration of 0.2 mol/l onto glass substrate that was placed onto the soldered tin bath heated up to 600.degree. C., and using the solution feed rate of 3.3 ml/min.
Figure 6A:
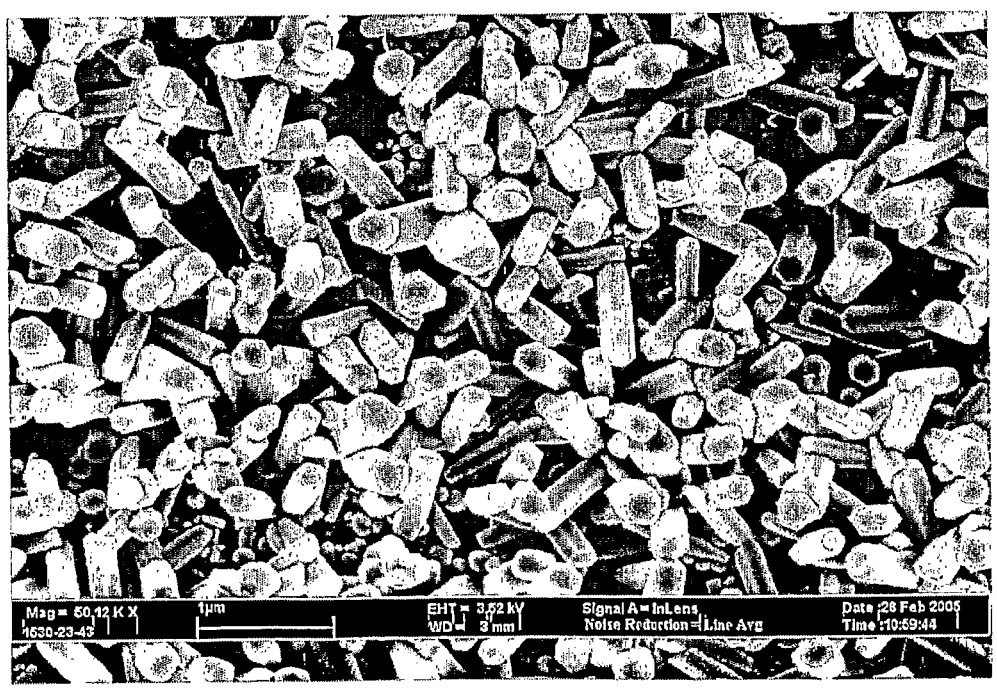
FIG. 6A is a SEM micrograph of the nanostructured zinc oxide layer that is prepared from zinc chloride solution with concentration of 0.1 mol/l onto glass substrate that was placed onto the soldered tin bath heated up to 525.degree. C., and using the solution feed rate of 2.3 ml/min.
Figure 6B:
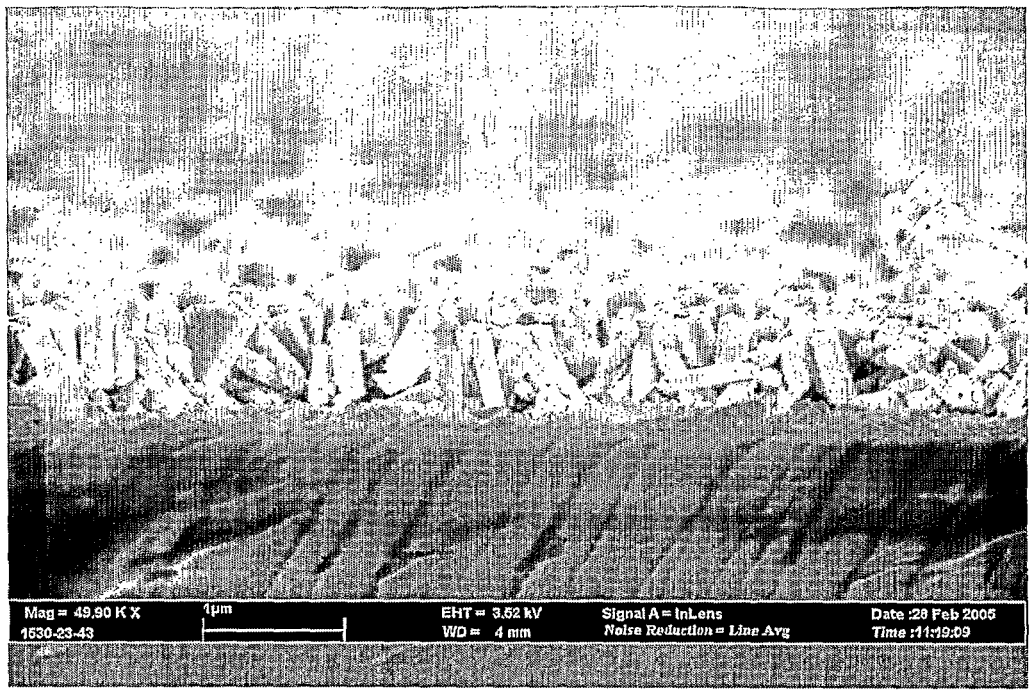
FIG. 6B is a SEM cross-section of the nanostructured zinc oxide layer that is prepared from zinc chloride solution with concentration of 0.1 mol/l onto glass substrate that was placed onto the soldered tin bath heated up to 525.degree. C., and using the solution feed rate of 2.3 ml/min.
Figure 7:
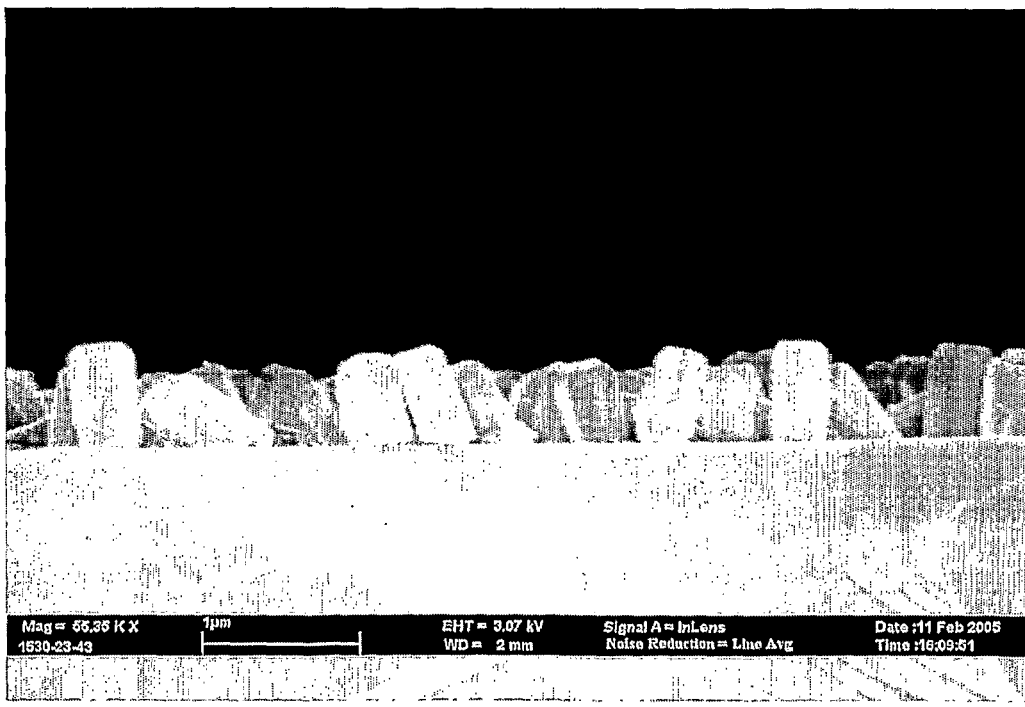
FIG. 7 is a SEM cross-sectional image of the nanostructured zinc oxide layer that is deposited from the aqueous solution containing zinc chloride (0.05 mol/l) and thiourea (tu) at molar ratio of Zn:S=1:1 onto glass substrates that was placed onto the soldered tin bath heated up to 620.degree. C.

The process of preparing nanostructured zinc oxide layers comprising nanorods or nanoneedles on a substrate according to present invention requires a solution comprising a precursor, such as zinc salt, e.g., zinc chloride ($ZnCl_2$), or zinc acetate ($Zn(CH_3COO)_2$). Aqueous or aqueous-alcoholic solution can be used, whereas the concentration of zinc chloride in the solution can be from about 10 mmol up to about 0.4 mol per liter, and preferably from about 0.05 mol/l to 0.2 mol/l.

Suitable substrate for the nanostructured zinc oxide layer is glass, silicon, quartz, or metal oxide (such as indium tin oxide, titanium oxide, zinc oxide) covered glass. The substrate must be heated up, whereas the temperature of the surface (on which the nanostructured ZnO layer is to be prepared—hereinafter also called the first surface), prior to deposition is from about 400 to about 650.degree. C. for Silicon and quartz and 400.degree. C. to 600.degree. C. for glass and metal oxide covered glass. This temperature is also known as growth temperature.

Different methods can be used for heating the substrate. For example, to guarantee the homogeneous temperature of the substrate, substrate is placed onto a soldered metal bath (the surface that is facing the soldered metal is hereinafter also called the second surface), and the temperature of the first surface of the substrate is controlled indirectly by controlling the temperature of the soldered metal. The metal having low vapor pressure, e.g., tin (Sn) could be used as the soldered metal.

Also, heat plate can be used as heating element instead of soldered metal bath.

It is apparent that a temperature difference exists between the temperature of the heating element (e.g., soldered metal) and the temperature of the first surface of the substrate, whereas this difference is substantial for substrates like glass and metal oxide covered class and nearly zero for Silicon. For example, if soldered metal bath is used, the temperature of the soldered metal is about 70 to about 130 degrees higher than the growth temperature for the range of growth temperatures between about 400.degree. C. to 600.degree. C. for a glass/quartz substrate with a thickness of about 1 mm.

Other methods, known in the art, can be used to heat the substrate.

Lower growth temperatures are preferred as less energy is needed for preheating the substrate and for maintaining the predetermined temperature.

Atomization, i.e. producing a spray of small droplets of the solution of a required size, is then carried out. Any suitable means can be used, e.g., ultrasonic spray atomizer, pneumatic spray atomizer.

The spray of small droplets of the solution is then directed to the substrate, thereby creating a layer of nanostructured zinc oxide, comprising nanorods or nanoneedles, on the substrate. The orientation of the nanorods or needles does not depend on the direction of the spray stream is applied on the substrate, but rather on the properties of substrate (or the layer of metal oxide on the substrate, as the case might be).

The deposition can be carried out in an open system. Compressed air (at 2-3 bar) can be used as a carrier gas for the deposition process. However, also nitrogen, or argon can be used, if needed. A flow rate of the carrier gas is preferably from about 5 to about 9 l/min.

According to another embodiment of the invention, zinc chloride is dissolved in a solvent, comprising water and suitable alcohol, such as propanol, isopropanol, ethanol or methanol, e.g., in ratio 1:1 to 2:3 (by volume). Aqueous-alcoholic solution allows the process to be carried out at the lower temperatures of the heating element compared to when aqueous solution is used.

According to another embodiment of the invention, a solution additionally comprises thiourea. The amount of thiourea is selected so that the molar ratios of precursors Zn:S is from 1:1 to 4:1.

Figure 8:
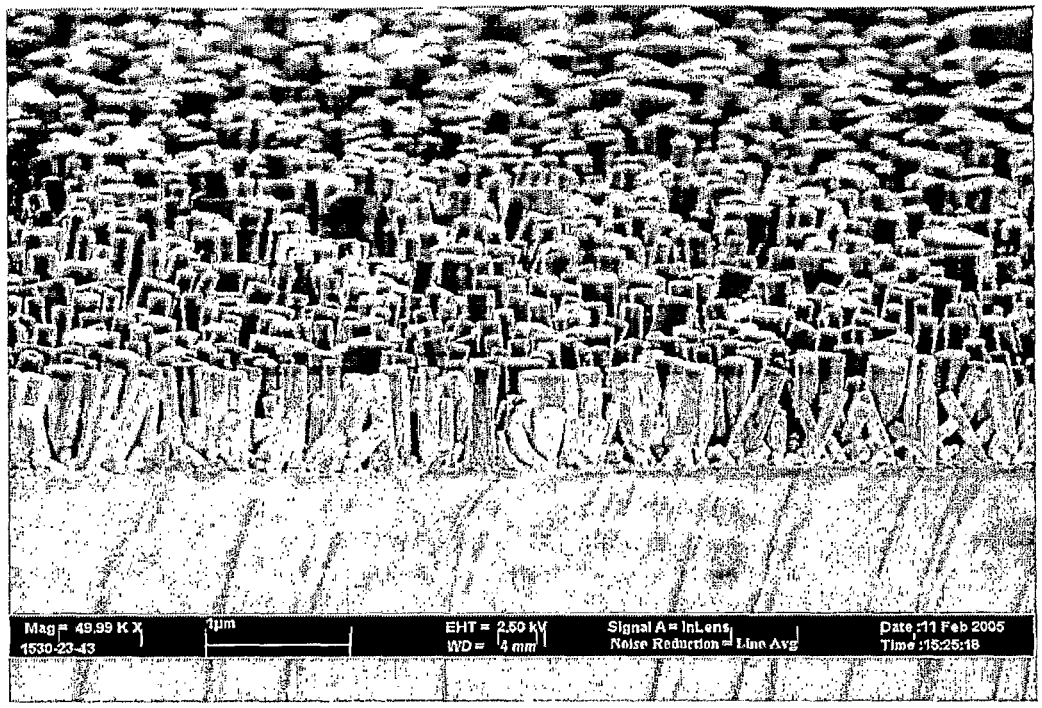
FIG. 8 is a SEM cross-sectional image of the nanostructured zinc oxide layer that is deposited from the aqueous solution containing zinc chloride (0.05 mol/l) and thiourea at molar ratio of Zn:S=3:1, deposited onto glass substrates that was placed onto the soldered tin bath heated up to 620.degree. C.
Figure 9:
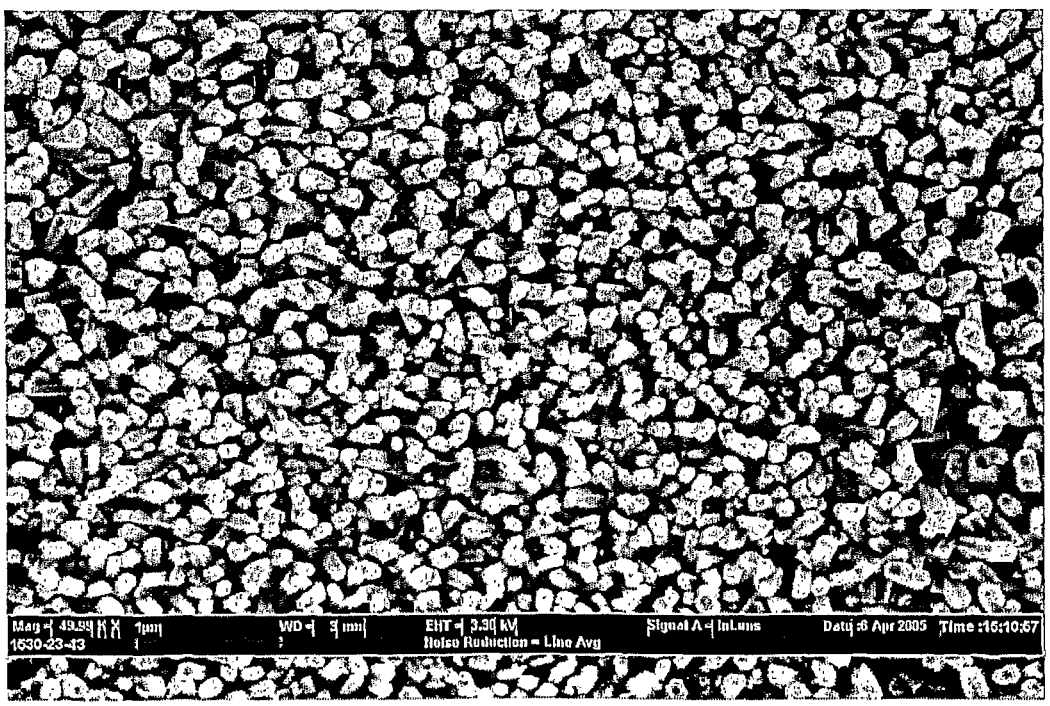
FIG. 9 is a SEM cross-sectional image of the nanostructured zinc oxide layer that is deposited from the isopropanol and water solution (in ration 1:1 by volume) with zinc chloride concentration of 0.1 mol/l, deposited onto glass substrate that was placed onto the soldered tin bath heated up to 525.degree. C., and solution feed rate 2.0 ml/min.
Figure 10:
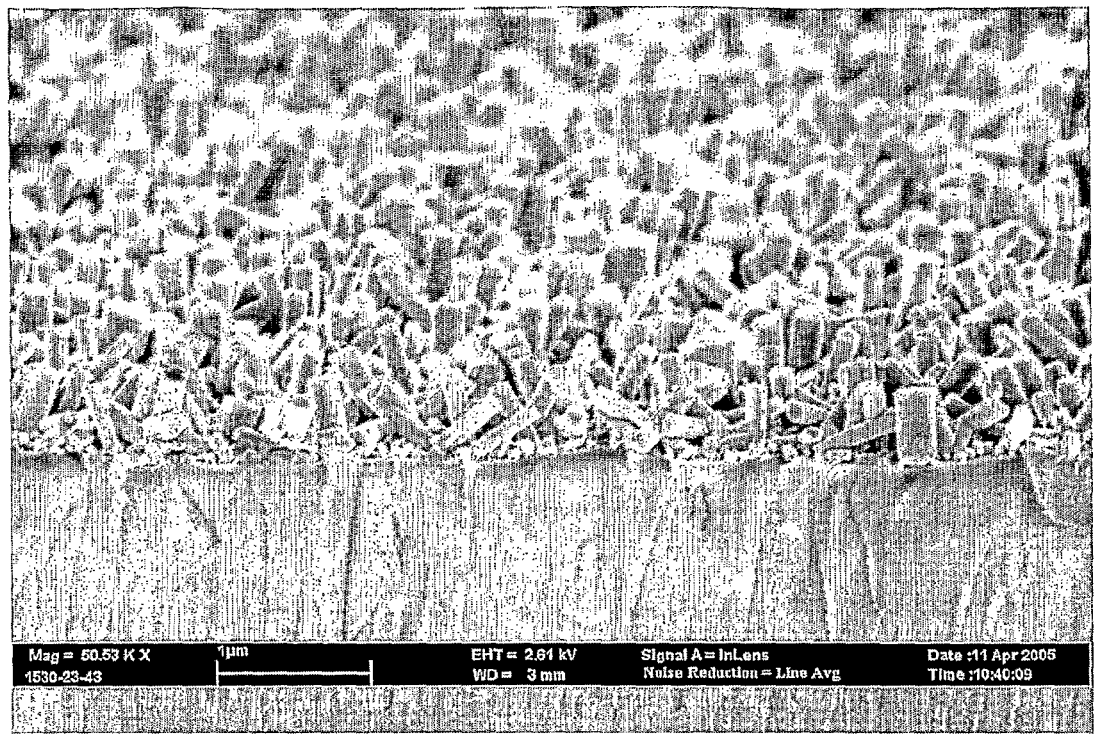
FIG. 10 is a SEM cross-sectional image of the nanostructured zinc oxide layer that is deposited from the solution containing zinc chloride (0.1 mol/l) and urea at molar ratio of 1:1 onto glass substrates that was placed onto the soldered tin bath heated up to 580.degree. C., and solution feed rate 2.2 ml/min.
Figure 11:
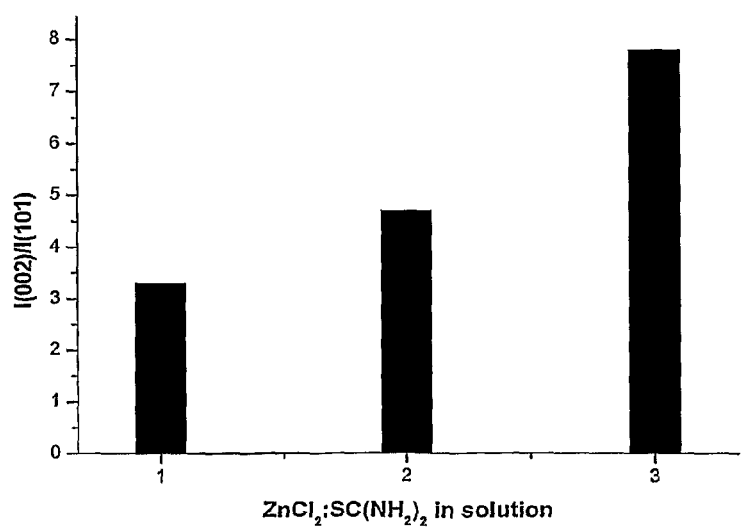
FIG. 11 is a ratio of zinc oxide (002) peak intensity to (101) plane intensity (I(002)/I(101)) in the XRD pattern for the layers with different amount of thiourea (tu) in the stock solution of the samples (prepared at constant tin bath temperature of 620.degree. C., temperature at the substrate surface (the growth temperature) approximately 500.degree. C.)

Adding thiourea to the solution allows to grow the film consisting of highly c-axis orientated ZnO columns (FIG. 8)

According to another embodiment of the invention, a solution additionally comprises urea (carbamide, $OC(NH_2)_2$) as a precursor, whereas a precursor ratio $ZnCl_2$:$OC(NH_2)_2$ in the solution is from about 1:1 to about 4:1.

According to another embodiment of the invention, zinc acetate is used as precursor, i.e., zinc acetate dihydrate is dissolved in aqueous or aqueous-alcoholic solution. Zinc oxide layers comprising nanoneedles (with shape of cones and size of: diameter at bottom from 5-10 to 50 nm and length up to 200 nm) in between and on leaf-like grains/on the surface of ZnO film can be prepared. The deposition temperature can be varied from about 350-450.degree. C., preferably 370-400.degree. C. Solution concentrations can be varied from about 0.1 mol/l to about 0.4 mol/l.

EXAMPLES

Several samples of zinc oxide nanocolumnar layers were prepared, whereas the following parameters were varied: growth temperature, stock solution composition, concentration of the precursors in stock solution, solution feeding rate, type of substrate, type of underlayers (metal oxides), and carrier gas flow rate. Samples were studied by the techniques of X-ray diffraction (XRD), scanning electron microscopy (SEM), transmission electron microscopy (TEM), and photoluminescence (PL). The results are shown in FIGS. 1 to 19.

The solutions were prepared at the room temperature (from about 18 to about 25.degree. C.), but generally, the temperature of the solution is not critical.

Zinc chloride (pro analysis, Merck) or zinc acetate dihydrate (pro analysis, Merck), thiourea (pro synthesis, Merck), Urea (pro synthesis, Merck), 2-propanol (pro analysis, Merck), Ethanol (pro analysis, Merck), deionized water (with specific resistance 18 $M\Omega.cm$) were used as starting materials.

A soldered metal bath was used as a heating element. The bath is a custom-made stainless steel cylinder with diameter 80 mm, depth 20 mm, compromising a cavity for a thermocouple. Temperature of the bath was set and electronically controlled using a thermocouple which is directly contacted with the bath and a temperature controller (Love 16010 by Dwyer Instruments). Solution was atomised using air atomizing nozzle (W/O SU 1/4JN-SS by Spraying Systems; allows to set different solution flow rates), comprising fluid cap PF1650-SS and air cap PA64-SS. Carrier gas flow rate was controlled by a flowmeter EK-4AR (Kytolo Incorporated).

The layers are consisting of well-developed hexagonal rods of zinc oxide with length from 500-800 nm up to 7000 nm, the diameter of rods could be varied from 20 nm up to 1000 nm. The aspect ratio (length to diameter) of the crystals is from 1.5 up to 20.

Study by X-Ray Diffraction (XRD)

Figure 12:
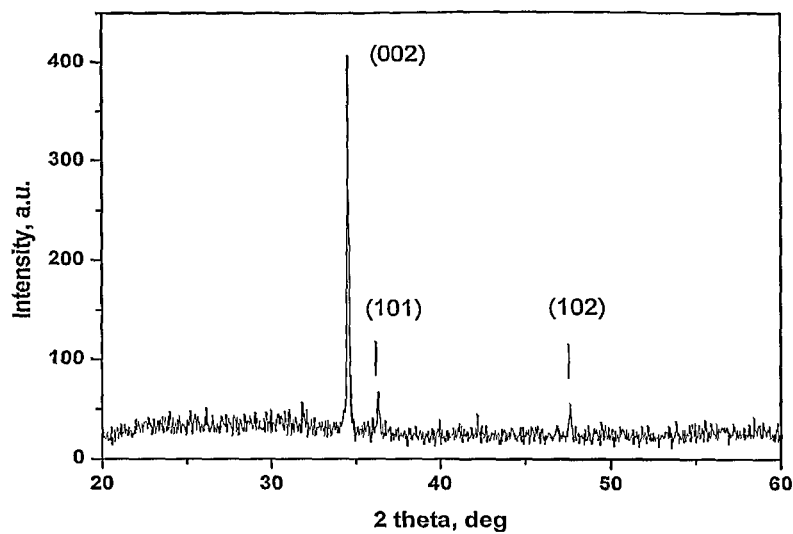
FIG. 12 is an XRD pattern of the sample that is depicted on FIG. 1.
Figure 13:
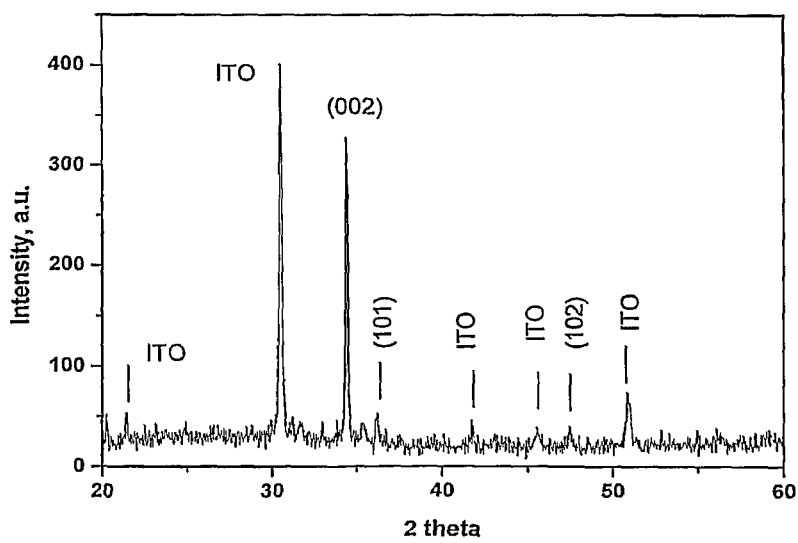
FIG. 13 is an XRD pattern of the sample that is depicted on FIG. 2.
Figure 14:
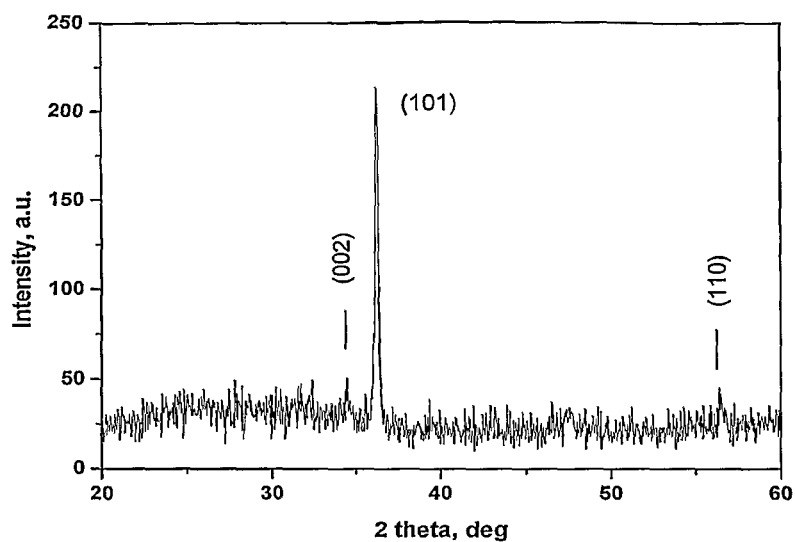
FIG. 14 is an XRD pattern of the sample, depicted on FIG. 3.
Figure 15:
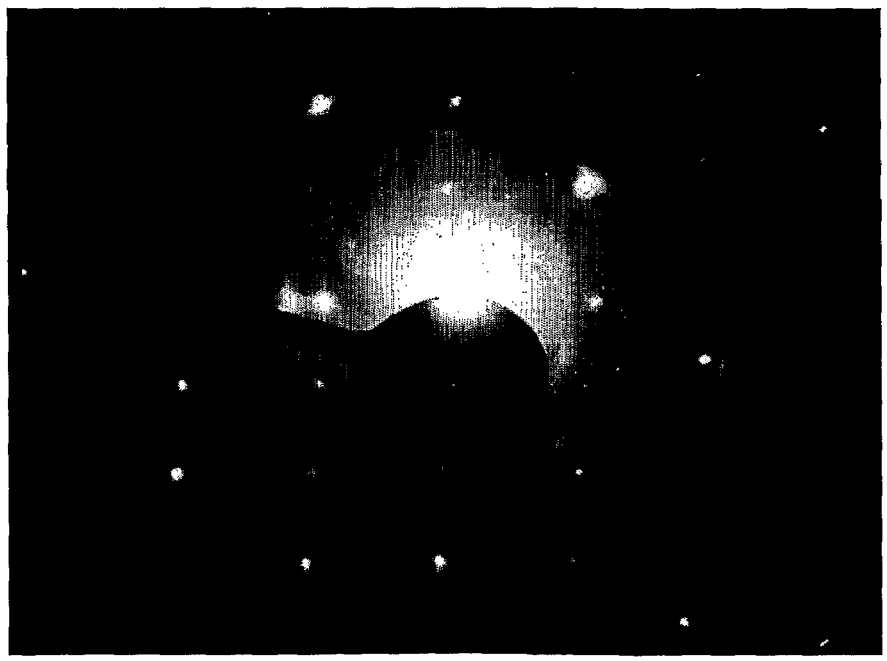
FIG. 15 is a RHEED pattern of a zinc oxide nanorod.

XRD diffraction patterns were recorded for the prepared layers deposited onto different substrates. The replicas of deposited layer on the diffractograms are belonging to the hexagonal zinc oxide (PDF 36-1451) independent of the substrate at deposition temperatures 400-600.degree. C. (it should be appreciated that if the solution contains thiourea, the temperature will increase as the decomposition of zinc chloride thiourea complex compound formed in solution is exothermic process (runks M. et al Journal Thermal analysis and Calorimetry, 72 (2003) 497-506). The crystallites in the film are orientated in the (002) direction (c-axis perpendicularly to the substrate) if grown onto the glass and conductive oxide covered substrates (FIGS. 12 and 13). The ratio of the peak intensities (I(002)/I(101)) is about 10 when ZnO nanorods were prepared onto glass or ITO substrates. Depositing the solution onto thin flat ZnO film, the crystallites in the layer show preferred orientation in the (101) direction (FIG. 14). Flat ZnO film has the thickness of 50-200 nm and is prepared by spray pyrolysis from the solution of zinc acetate dihydrate dissolved in deionized water. Indium was added in amount of 1 at % (from indium chloride) into the solution to make flat films conductive. (It is apparent that Flat ZnO films could be prepared by other methods as well, for example, by RF magnetron sputtering technique). Appears that using thiourea in solution allows to grow highly c-axis orientated rods/crystals of ZnO, the evolution of the preferred orientation by the Zn:S molar ratio in solution is presented in FIG. 11.

Study by Transmission Electron Microscope (TEM)

The structure of sprayed nanorods was studied on a TEM EMV-100BR. Both, bright field (B.F.) and dark field (D.F.) images were studied. TEM and reflective high energy electron diffraction (RHEED) investigations were carried out at 100 kV accelerating voltage. A standard C (Pt) replicas method was used. The RHEED pattern of the nanorod is presented in FIG. 15. TEM study confirms that grown rods are single crystals of ZnO.

Photoluminescence (PL) Study

Figure 16:
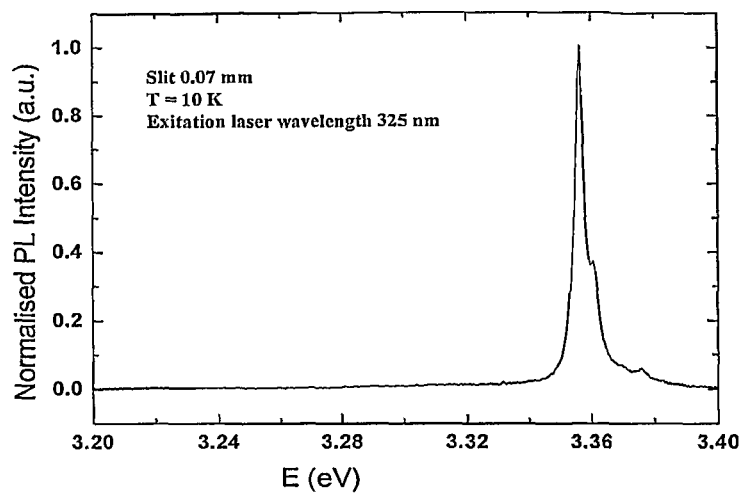
FIG. 16 is a near band edge PL spectrum of zinc oxide nanorods.
Figure 17:
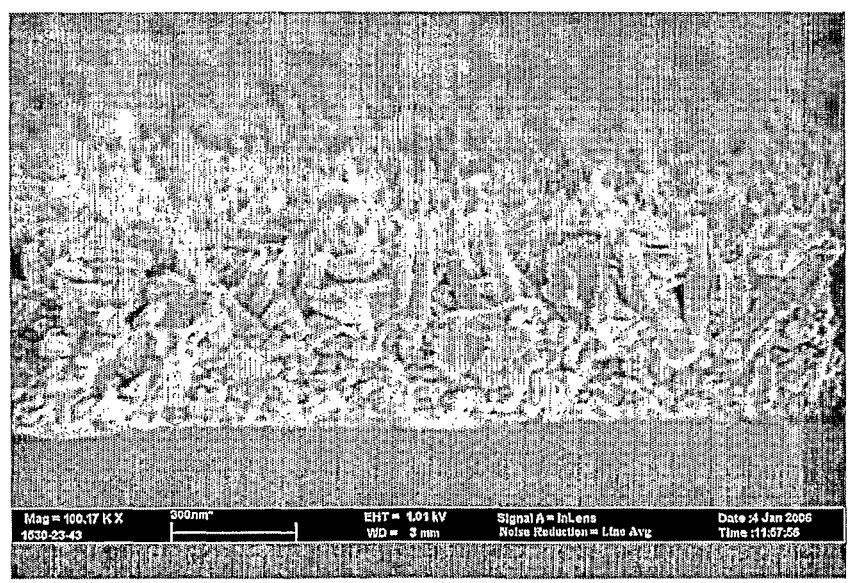
FIG. 17 is a SEM cross-sectional image of the nanostructured zinc oxide layer that is deposited from aqueous-alcoholic solution of zinc acetate (0.2 mol/l) onto glass substrate that was placed onto soldered tin bath heated up to 450.degree. C.
Figure 18:
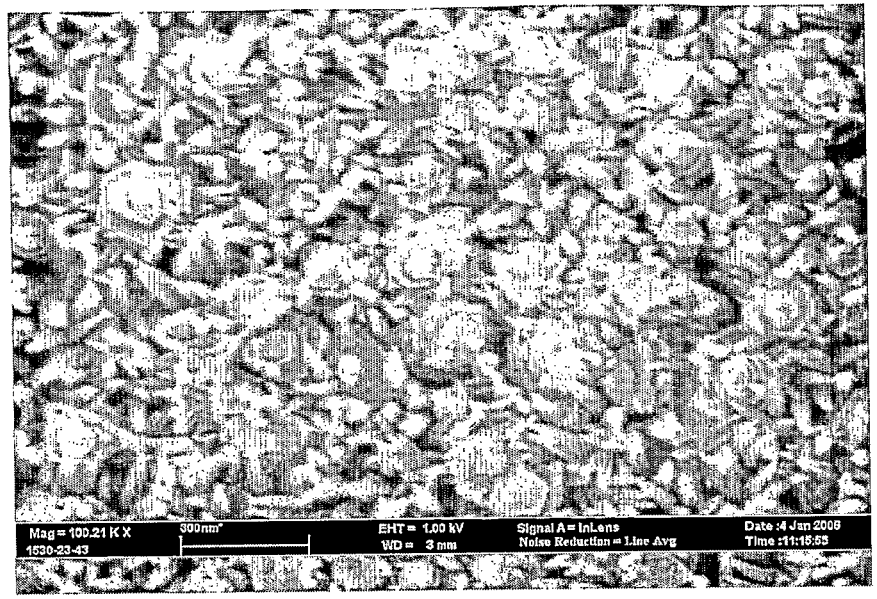
FIG. 18 is a SEM micrograph of the surface of the nanostructured zinc oxide layer that is deposited from aqueous-alcoholic solution of zinc acetate (0.2 mol/l) onto glass substrate that was placed onto soldered tin bath heated up to 450.degree. C.
Figure 19:
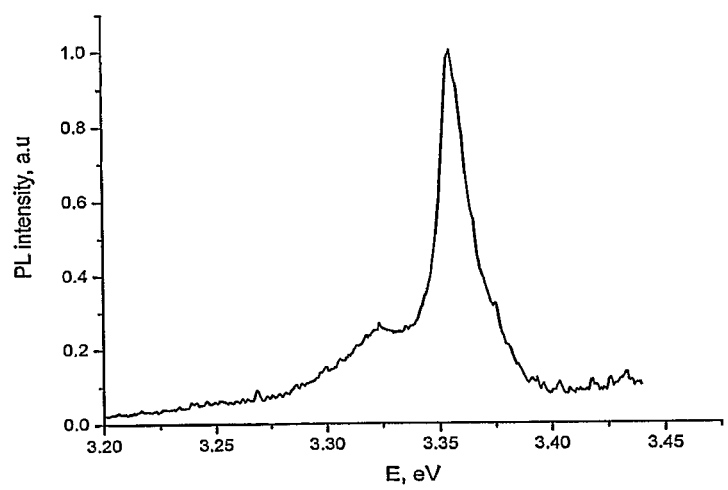
FIG. 19 is a near band edge PL spectrum of nanostructured zinc oxide layer comprising zinc oxide nanoneedles.

The near band edge photoluminescence (PL) spectrum of zinc oxide nanorods measured at 10 K (laser exitation wavelength 325 nm) is presented in FIG. 16. PL spectrum shows very sharp emission peak at 3.356 eV, with two satelites at 3.361 and 3.376 eV. The recorded near band edge photoluminescence spectrum and absence of PL green emission band verifies high purity and perfect crystallinity of zinc oxide nanorods. PL spectrum in UV region of the sample comprising nanoneedles on the surface is presented in FIG. 19, showing that the zinc oxide nanoneedles are also of high purity and with perfect crystallinity.

The exemplary embodiments presented herein illustrate the principles of the invention and are not intended to be exhaustive or to limit the invention to the form disclosed; it is intended that the scope of the invention be defined by the claims appended hereto and their equivalents.

What is claimed is:

1. Method of preparing nanostructured zinc oxide (ZnO) layers said layer comprising nanostructures chosen from the group of nanostructures consisting of ZnO nanorods and nanoneedles, on a substrate selected from a group consisting of Silicon, glass and quartz, said substrate having a first surface coated in a metal oxide, and a second surface, the method comprising the steps of:

heating the substrate to a predetermined temperature, wherein said predetermined temperature is from 350° C. to 650° C.;

atomizing a solution, comprising a precursor, an additive, and a solvent, into small discrete droplets using spray technique, wherein said precursor is selected from the group consisting of zinc chloride ($ZnCl_2$) and zinc acetate ($Zn(CH_3COO)_2$) and said additive is selected from the group consisting of thiourea ($SC(NH_2)_2$) and urea ($OC(NH_2)_2$); and depositing the atomized solution on the first surface of the substrate, using predetermined solution feeding rate, whereas the solvent evaporates when reaching the substrate, and said precursor reacts to form the nanostructured zinc oxide layer.

2. The method according to claim 1, wherein a precursor molar ratio $ZnCl_2$: $SC(NH_2)_2$ in the solution is from about 1:1 to about 4:1.

3. The method according to claim 2, wherein the predetermined temperature of said first surface of said substrate is from about 400° C. to about 600° C.

4. The method according to claim 1, wherein a precursor molar ratio $ZnCl_2$: $OC(NH_2)_2$ in the solution is from about 1:1 to about 4:1.

5. The method according to claim 4, wherein the predetermined temperature of said first surface of said substrate is from about 400° C. to about 600° C.

6. The method according to claim 1, wherein said solvent is selected from the group consisting of $H_2O$, alcohols, and combinations thereof.

7. The method according to claim 6, wherein said solvent comprises $H_2O$ and an alcohol, and a ratio of $H_2O$ and said alcohol is from about 1:1 to about 2:3 by volume.

8. The method according to claim 7, wherein said alcohol is selected from the group of propanol, isopropanol, ethanol, methanol, and combinations thereof.

9. The method according to claim 8, wherein the concentration of zinc chloride is from about 0.01 moles per liter to about 0.4 moles per liter.

10. The method according to claim 1, wherein the predetermined solution feeding rate is from about 1 ml/min to about 5 ml/min.

11. The method according to claim 1, wherein the metal oxide is selected from a group of indium tin oxide, tin oxide, titanium oxide, and zinc oxide.

12. The method according to claim 1, wherein the depositing is performed in an open system and air or compressed air is used as a carrier gas.

13. The method according to claim 12, wherein a flow rate of said carrier gas is between about 5 l/min to about 9 l/min.

14. The method according to claim 1, wherein nitrogen or argon is used as a carrier gas.

15. The method according to claim 1, wherein the heating of said substrate is performed by bringing a heating element into contact with the second surface of the substrate, and the temperature of the first surface of the substrate is controlled indirectly by controlling the temperature of the heating element.

16. The method according to claim 15, wherein soldered metal bath is used as said heating element, a metal oxide covered glass with a thickness of about 1 mm is used as said substrate, and a temperature of said soldered metal in said bath is from about 400° C. to about 650° C.

17. The method according to claim 1, wherein said predetermined temperature of said first surface of said substrate is from about 350° C. to about 600° C.

18. The method according to claim 1, wherein said solvent is $H_2O$ and wherein the concentration of zinc acetate is from about 0.1 moles per liter to about 0.4 moles per liter.

* * * * *